(12) United States Patent
Wu

(10) Patent No.: US 8,847,649 B2
(45) Date of Patent: Sep. 30, 2014

(54) CIRCUIT AND METHOD OF ADJUSTING SYSTEM CLOCK IN LOW VOLTAGE DETECTION, AND LOW VOLTAGE RESET CIRCUIT

(75) Inventor: Wen-Che Wu, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 701 days.

(21) Appl. No.: 12/587,037

(22) Filed: Oct. 1, 2009

(65) Prior Publication Data

US 2010/0090730 A1 Apr. 15, 2010

(30) Foreign Application Priority Data

Oct. 9, 2008 (TW) .............................. 97138949 A

(51) Int. Cl.
*H03K 3/017* (2006.01)
*G06F 1/30* (2006.01)
*G06F 1/24* (2006.01)

(52) U.S. Cl.
CPC . *G06F 1/305* (2013.01); *G06F 1/24* (2013.01)
USPC .......................................................... 327/172

(58) Field of Classification Search
USPC ......... 327/172–176, 231, 232, 237, 238, 240, 327/241
See application file for complete search history.

(56) References Cited

U.S. PATENT DOCUMENTS

| 5,801,987 | A  | * | 9/1998 | Dinh ........................ 365/185.18 |
| 7,177,381 | B2 | * | 2/2007 | Kim et al. ...................... 375/376 |
| 7,449,926 | B2 | * | 11/2008 | Sakai et al. ................... 327/142 |
| 8,296,588 | B2 | * | 10/2012 | Nakano ........................ 713/300 |
| 2003/0075735 | A1 | * | 4/2003 | Nakano ........................ 257/200 |
| 2005/0204010 | A1 | * | 9/2005 | Ueshima et al. .............. 709/206 |

* cited by examiner

*Primary Examiner* — Sibin Chen
(74) *Attorney, Agent, or Firm* — McClure, Qualey & Rodack, LLP

(57) ABSTRACT

The present invention discloses a circuit and a method of adjusting system clock in low voltage detection, and a low voltage reset circuit. The circuit of adjusting system clock in low voltage detection comprises: a clock generator for supplying a clock to at least one circuit in a system; and a low voltage reset circuit for generating an adjustment signal according to a detected voltage level, so that the clock generator adjusts or stops the clock supplied to the at least one circuit in the system.

12 Claims, 5 Drawing Sheets

CIRCUIT AND METHOD OF ADJUSTING SYSTEM CLOCK IN LOW VOLTAGE DETECTION, AND LOW VOLTAGE RESET CIRCUIT

BACKGROUND OF THE INVENTION

1. Field of Invention

The present invention relates to circuits and methods for adjusting a system clock in response to low voltage detection; particularly, it relates to circuits and methods which suspend or slow down, but do not immediately reset, an essential clock inside of an integrated circuit when a low voltage condition is detected, and a corresponding low voltage reset circuit.

2. Description of Related Art

An electronic circuit often requires a low voltage reset (LVR) circuit which is capable of generating a reset signal to initialize internal settings of the electronic circuit during system power on process. The electronic circuit may further include another LVR circuit which may be the same as or different from the previous LVR circuit, to reset the electronic circuit when a low voltage condition occurs during system operation, so as to avoid damages caused by circuit malfunction.

Typically, a specification of normal operation voltage range is defined in product design and development. When it is detected that the operation voltage is lower than the lower voltage limit, the LVR circuit will be triggered. However for safety, this lower voltage limit is usually designed to be higher than required. For example, assuming that the standard operation voltage is 1.8V, it is typically designed to generate a reset signal when the supplied voltage is lower than 1.6V. However, such arrangement may unnecessarily reset the system due to an occasional voltage surge, such that the product can not pass product test wherein the conditions are usually set stricter. In the foregoing example, it often happens that the circuit is unnecessarily reset under ESD test, because voltages lower than 1.6 V often occur. Therefore, it is preferred if the threshold for low voltage reset can be set to a lower level to avoid triggering unnecessary reset. However, this is in conflict with the design specification which guarantees a minimum operation voltage, that is, there is a potential risk of circuit malfunction if the lower voltage limit is set lower.

In view of the foregoing drawback, the present invention is proposed as a solution to it.

SUMMARY OF THE INVENTION

The first objective of the present invention is to provide a circuit of adjusting system clock in low voltage detection, which first adjusts the speed of an essential clock inside an integrated circuit when it detects that the operation voltage is lower than the normal operation range, and next resets the circuit when it detects an even lower voltage. Accordingly, when temporary voltage fluctuation occurs, it can avoid repetitively resetting the circuit, and also prevents the circuit from malfunctioning.

The second objective of the present invention is to provide a method of adjusting system clock in low voltage detection.

The third objective of the present invention is to provide a low voltage reset circuit.

In order to achieve the foregoing objective, in one perspective, the present invention provides a circuit of adjusting system clock in low voltage detection, comprising: a clock generator for supplying a clock to at least one circuit in a system; and a low voltage reset circuit for generating an adjustment signal according to a level of a voltage to be detected, so that the clock generator adjusts or stops the clock supplied to the at least one circuit in the system. The voltage to be detected for example can be a supplied voltage.

In another perspective, the present invention also provides a method of adjusting system clock in low voltage detection, comprising: detecting a level of a supplied voltage; and generating an adjustment signal to control a clock generator according to the detection result.

In yet another perspective, the present invention also provides a low voltage reset circuit comprising: a voltage division circuit dividing a supplied voltage to generate multiple reference voltages; a comparator circuit comparing a voltage signal related to the supplied voltage with the multiple reference voltages; and a logic circuit determining whether to generate an adjustment signal according to the comparison result.

In the foregoing circuit and method, the adjustment signal is preferably generated when the supplied voltage is lower than a first threshold value.

In addition, in the foregoing circuit and method, the adjustment signal is preferably not generated when the supplied voltage is lower than a second threshold value.

When the supplied voltage is lower than the second threshold value, a reset signal can be generated, such that a circuit receiving the reset signal is reset to default settings.

The objectives, technical details, features, and effects of the present invention will be better understood with regard to the detailed description of the embodiments below, with reference to the drawings.

DESCRIPTION OF THE PREFERRED EMBODIMENTS

Figure 1:
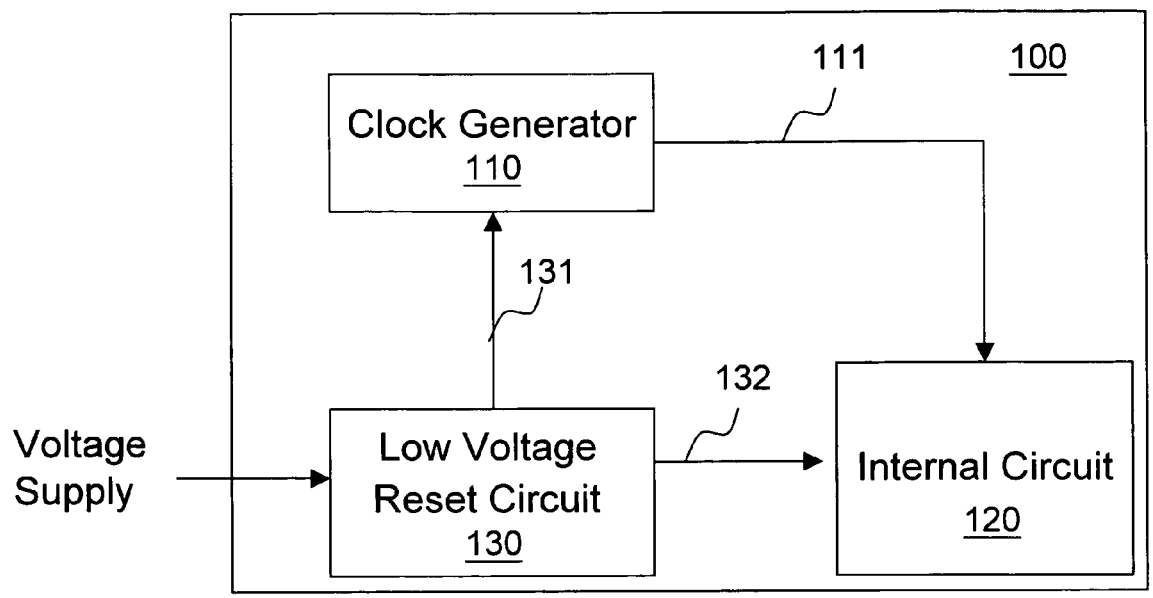
FIG. 1 is a schematic circuit diagram showing the first embodiment according to the present invention.
Figure 2:
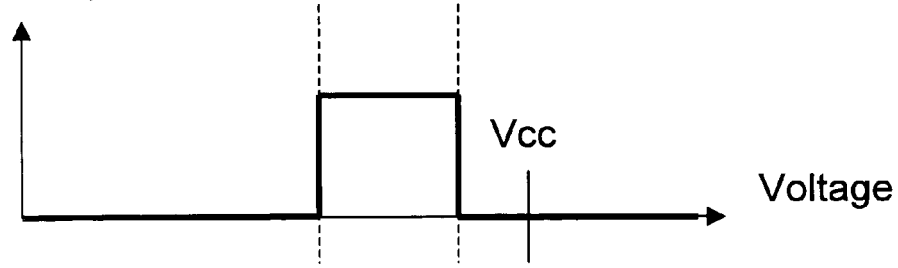
FIG. 2 illustrates the relationship between the adjustment signal, the reset signal and the supplied voltage.
Figure 2:
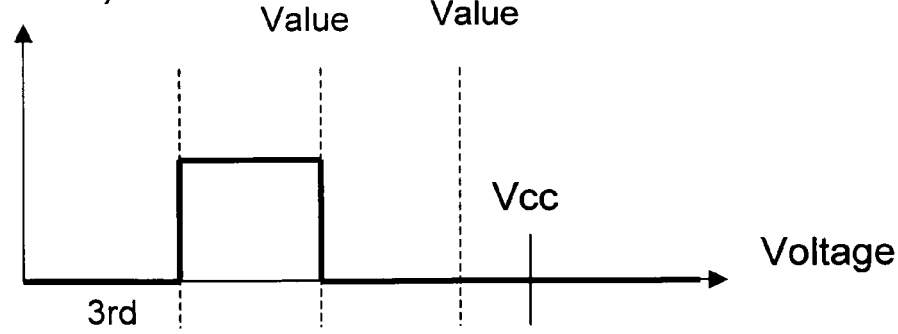

Please refer to FIG. 1 and FIG. 2. In accordance with the first embodiment of the present invention, a system 100 comprises a clock generator 110 for providing a clock 111 to an internal circuit 120, and a low voltage reset circuit 130 for detecting a supplied voltage. When the supplied voltage is lower than a first threshold value, the low voltage reset circuit 130 generates an adjustment signal 131 such that the clock generator 110 can suspend or slow down the clock 111, i.e., it does not output the clock 111. When the supplied voltage is lower than the second threshold value, the low voltage reset circuit 130 outputs a reset signal 132 to reset the internal circuit 120 to its default settings. In one embodiment, assuming that the normal operation voltage is Vcc±ΔV, the first threshold value may be set equal to the lower limit of the normal operation voltage (Vcc−ΔV), and the second threshold value may be set to a voltage lower than the lower limit. The range between the first threshold and the second threshold is referred to as a "clock frozen zone" hereinafter; in this zone, the system only suspends or slows down the clock but does not reset, so that it can avoid circuit malfunction while the system is not repetitively reset.

Figure 3A:
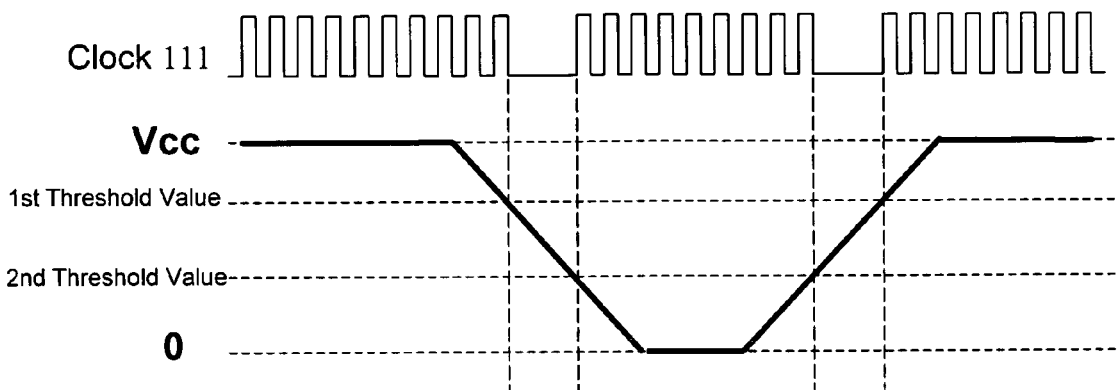
FIG. 3A illustrates an example of a relationship between a clock 111 and the supplied voltage.
Figure 3B:
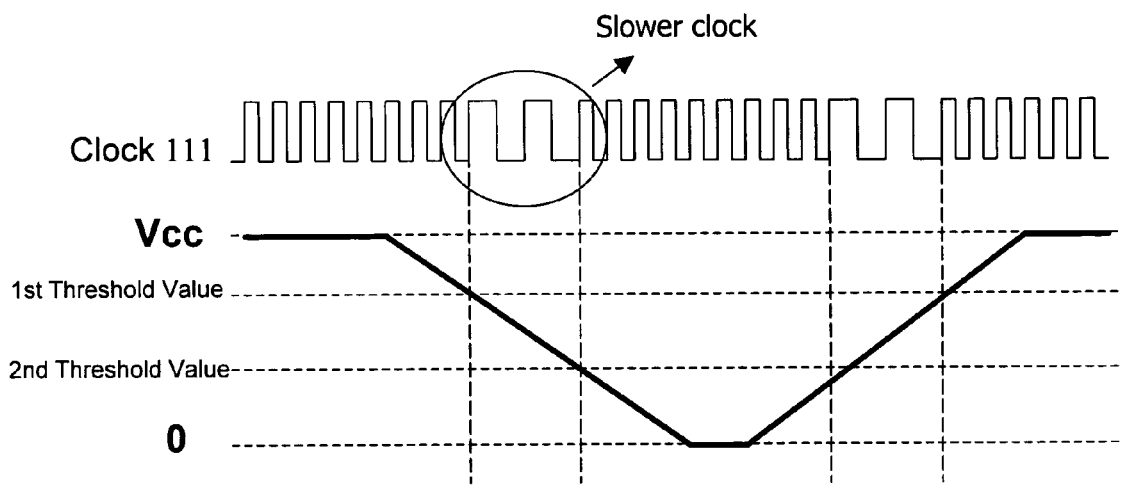
FIG. 3B illustrates another example of a relationship between the clock 111 and the supplied voltage.
Figure 4:
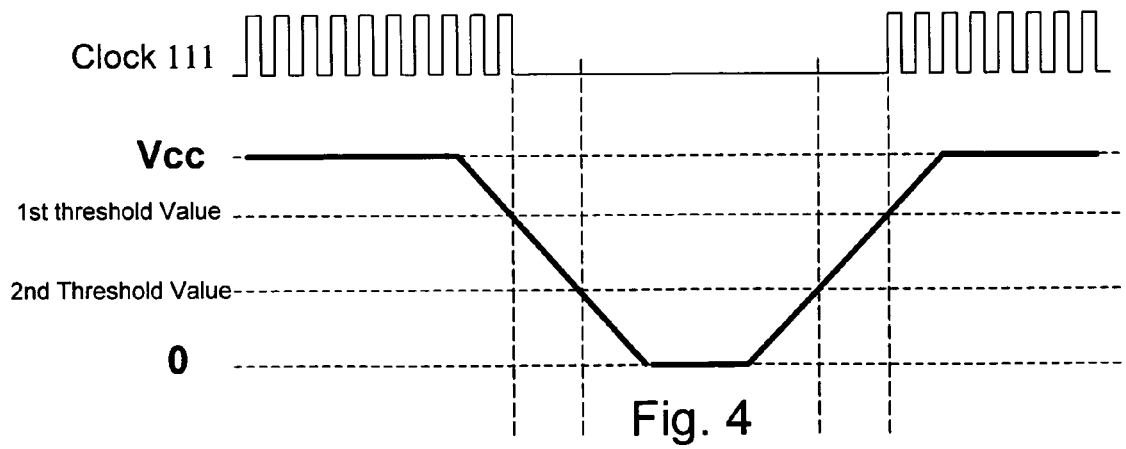
FIG. 4 illustrates another example of a relationship between the clock 111 and the supplied voltage.

FIG. 3A illustrates an example of a relationship between the clock 111 and the supplied voltage. When the supplied voltage operates within a normal operation range, the clock generator 110 supplies the clock 111. When the supplied voltage is lower than the first threshold value but higher than the second threshold value, the clock generator 110 suspends the clock 111. When the supplied voltage is lower than the second threshold value, the clock generator 110 resumes the clock 111, such that the internal circuit 120 can be reset to its default settings when the low voltage reset circuit 130 generates the reset signal 132. In another embodiment, when the supplied voltage is lower than the first threshold value but higher than the second threshold value, the clock 111 is adjusted to a different frequency, such as a slower clock as shown in FIG. 3B. Certainly, depending on different circuit requirement, it is also possible to keep stopping the clock 111 when the supplied voltage is lower than the second threshold value; in this case the waveform is as shown in FIG. 4.

Figure 5:
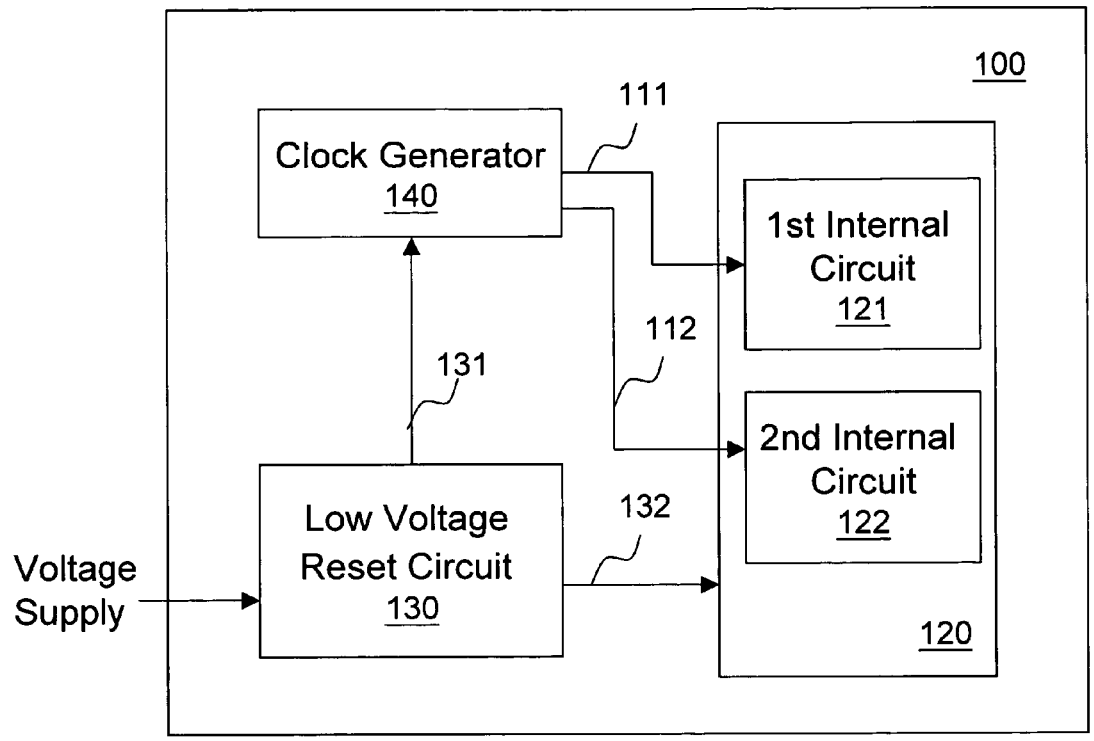
FIG. 5 is a schematic circuit diagram showing the second embodiment of the present invention.

In the first embodiment as shown in FIG. 1, when the clock generator 110 receives the adjustment signal 131, it adjusts or completely stops the clock 111, which is the only clock supplied to the internal circuit 120. FIG. 5 shows another embodiment of the present invention, wherein when the supplied voltage operates in the clock frozen zone, the clock generator 110 provides two or more clocks to the internal circuit 120. The internal circuit 120 includes a first internal circuit 121 which should be suspended (e.g., a circuit for storing data) and a second internal circuit 122 which should not be suspended (e.g., a timer). When a clock generator 140 receives the adjustment signal 131, it only stops providing the clock 111 to the first internal circuit 121, but still keeps providing a clock 112 to the second internal circuit 122. Or, in another embodiment, it can be arranged so that the clock 111 is not completely stopped, but changes to a different frequency.

Figure 6:
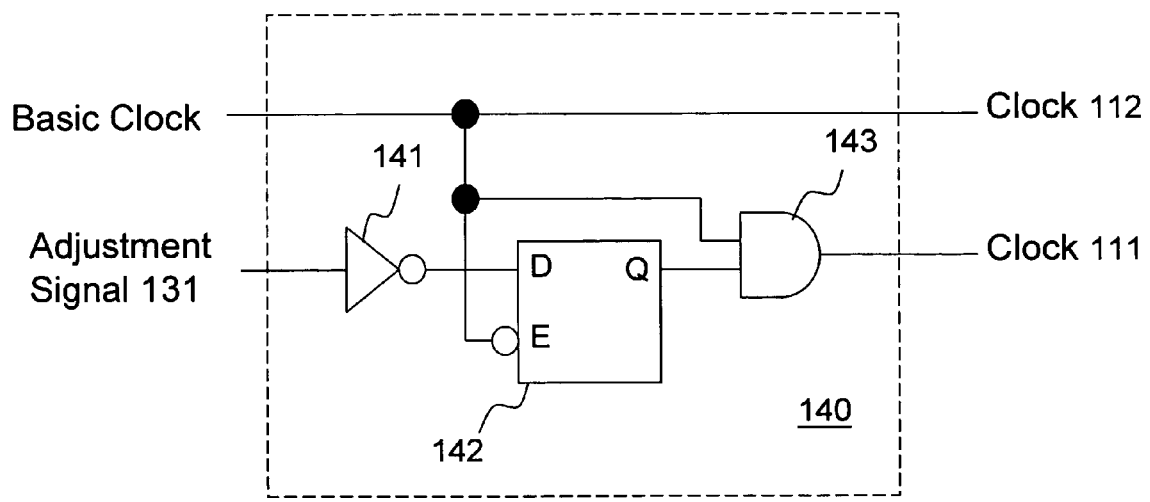
FIG. 6 shows an embodiment of the clock generator.

The clock generator 140 capable of achieving such function can be embodied in many forms. FIG. 6 illustrates one such embodiment; as shown in the figure, the clock generator 140 receives or generates by itself a basic clock. In accordance with this basic clock, the clock generator 140 outputs the clock 112 regardless whether an adjustment signal 131 is received or not. On the other hand, the clock generator 140 receives the adjustment signal 131, which is transmitted to a D flip flop 142 via an inverter 141. When the adjustment signal 131 is at high level and the D flip flop is enabled, the output of the D flip flop 142 is at low level; hence, the output of a logic circuit 143 is at low level. In other words, when the adjustment signal 131 is at high level, the clock generator 140 stops outputting the clock 111.

If the clock 111 is not to be stopped, but to be changed to a different frequency, the basic clock may go through a frequency divider (or multiplier). Or, the different frequency clock may be supplied by a different clock generator.

Figure 7:
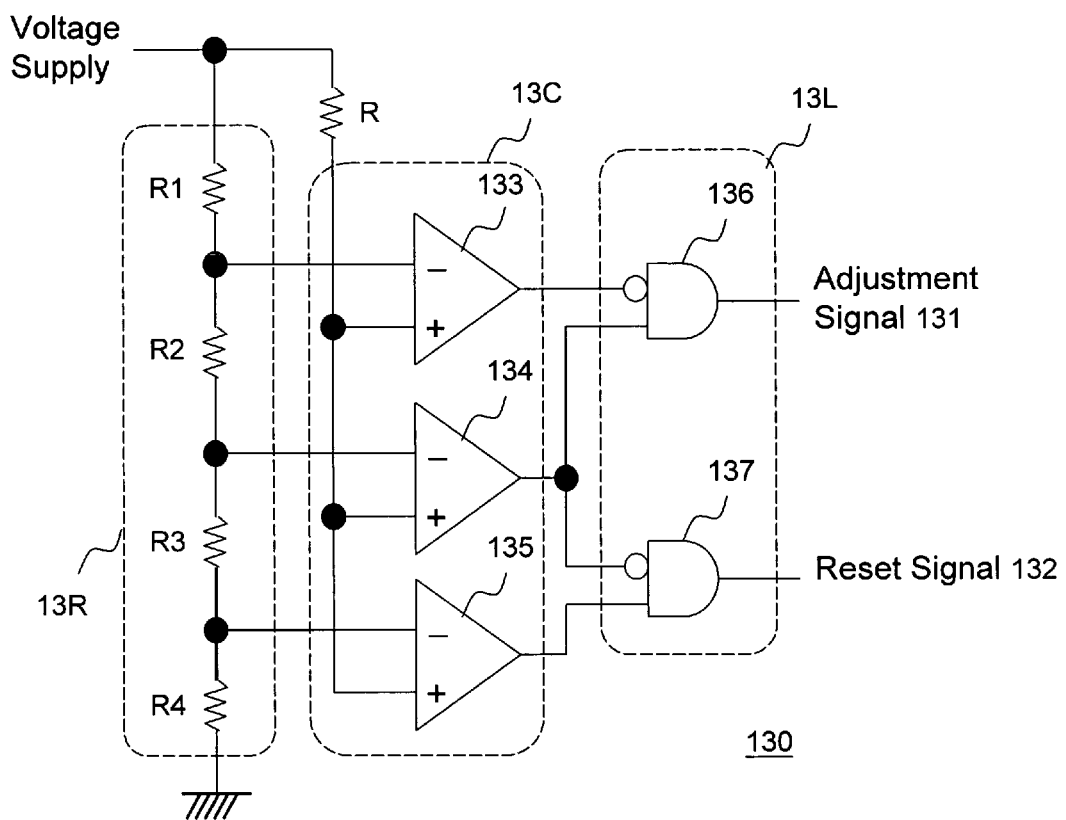
FIG. 7 shows an embodiment of a low voltage reset circuit.

The low voltage reset circuit 130 can be embodied in many forms. FIG. 7 illustrates one such embodiment; as shown in the drawing, the low voltage reset circuit 130 includes a voltage division circuit 13R, a comparator circuit 13C, and a logic circuit 13L. After the voltage division circuit 13R obtains a dividend voltage from a supplied voltage, the dividend voltage is compared with a reference voltage in the comparator circuit 13C, and next a logic operation is performed on the comparison result in the logic circuit 13L to determine whether to output an adjustment signal 131 or a reset signal 132. More specifically, in this embodiment, the voltage division circuit 13R is formed by resistors R1-R4, which divide the supplied voltage to different dividend voltages. These dividend voltages are taken as different reference voltages, supplied to the negative input terminals of the comparators 133-135 in the comparator circuit 13C, respectively. In addition, the supplied voltage, after voltage-dropped by a resistor R, is inputted to the positive input terminals of the comparators 133-135.

When the supplied voltage operates within the normal operation range, that is, when the supplied voltage is higher than the first threshold value, voltages at the negative input terminals of the comparators 133-135 are all higher than that at the positive input terminals. Therefore, all the outputs of the comparators 133-135 are low, and the outputs of the logic circuits 136 and 137 are both low.

When the supplied voltage is lower than the first threshold value but higher than the second threshold value, the voltage at the negative input terminal of the comparator 133 is lower than that at its positive input terminal; yet, the voltages at the negative input terminals of the other comparators 134-135 are still higher than that at their positive input terminals. The output of the comparator 133 is high, but the outputs of comparators 134-135 are low. Therefore, the logic circuit 136 changes its output and issues a high level adjustment signal 131; but the output of the logic circuit 137 is still low.

When the supplied voltage is lower than the second threshold value, the voltages at the negative input terminals of the comparators 133 and 134 are both lower than that at the positive input terminals; but the voltage at the negative input terminal of the comparator 135 is still higher than that at its positive input terminal. The outputs of the comparators 133 and 134 are high, but the output of the comparator 135 is low. Therefore, the logic circuit 136 changes its output to low level, but the logic circuit 137 changes its output to high level, and issues a high level reset signal 132.

When the supplied voltage is lower than the third threshold value (referring to FIG. 2), the voltages at the negative input terminals of comparators 133-135 are all lower than that at their positive input terminals. In this case, all the outputs of comparators 133-135 are high. Therefore, the logic circuit changes its output to low level and stops outputting the reset signal 132.

Figure 8:
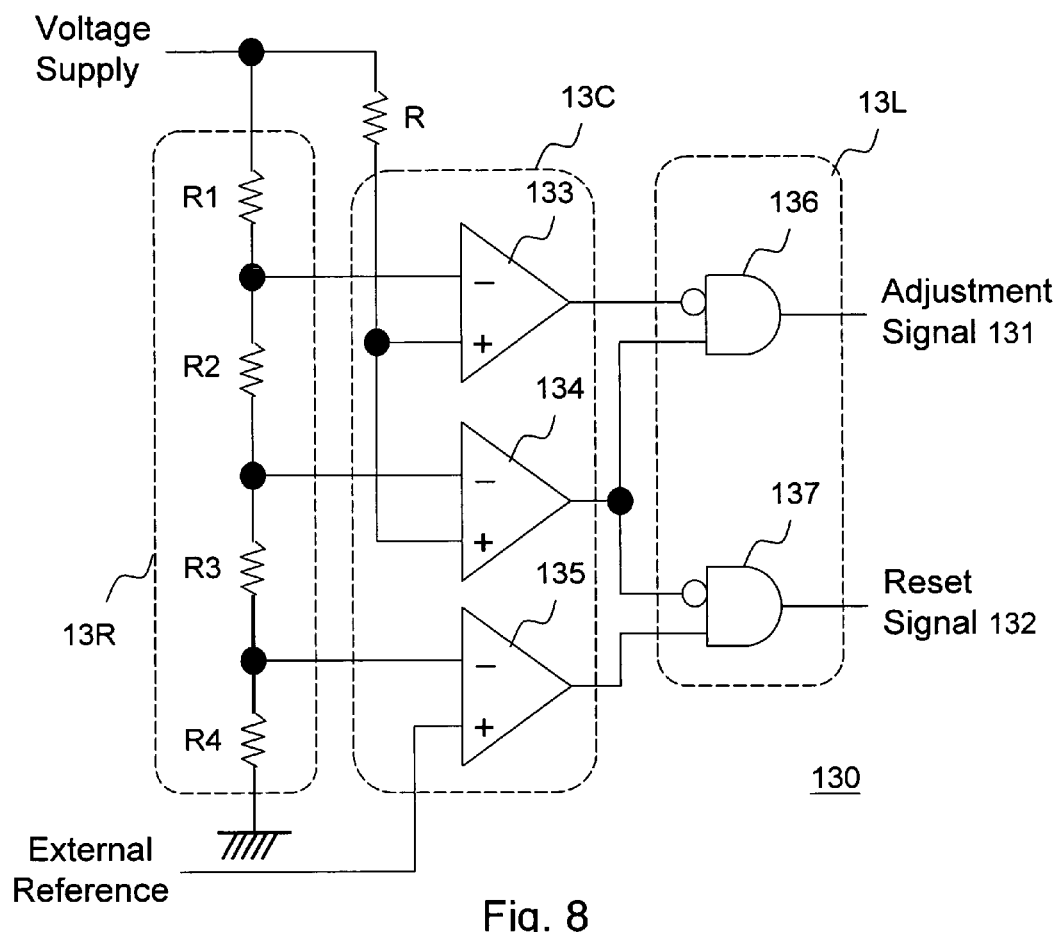
FIG. 8 shows another embodiment of the low voltage reset circuit.

FIG. 8 shows another embodiment of the low voltage reset circuit 130, wherein the threshold inputted to the comparator 135 comes from an external reference setting, instead of the voltage supply. The rest of the circuit is the same as that shown in FIG. 7.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. As mentioned earlier, the low voltage reset circuit and the clock generator can be embodied in many forms; for example, the signals can be generated in many ways, and the definitions of high and low levels of each signal can be modified, which should fall within the scope of the present invention. As another example, after the clock generator receives the adjustment signal, other than completely stopping the clock (the embodiment shown in FIG. 1), or stopping providing the clock to part of the circuit but keep providing the clock to another part of the circuit (the embodiment shown in FIG. 5), a slower or faster clock may be provided in accordance with the adjustment signal, to meet the requirement of different applications. In view of the foregoing, the spirit of the present invention should cover all such and other modifications and variations, which should be interpreted to fall within the scope of the following claims and their equivalents.

What is claimed is:

1. A circuit of adjusting system clock in low voltage detection, comprising:
 a clock generator for supplying a clock to at least one circuit in a system; and
 a low voltage reset circuit for generating an adjustment signal that is input to the clock generator according to a detected voltage level of a supply voltage, so that the clock generator adjusts or stops the clock supplied to the at least one circuit in the system, when the detected voltage level is lower than a predetermined first threshold value, the low voltage reset circuit generates the adjustment signal, and
 wherein the low voltage reset circuit also generates a reset signal that is input to the at least one circuit when the detected voltage level is lower than a predetermined second threshold value, such that the at least one circuit in the system is reset to a predetermined value, wherein the predetermined first threshold value is greater than the predetermined second threshold value.

2. The circuit of claim 1, wherein the low voltage reset circuit stops generating the adjustment signal when the detected voltage level is lower than the predetermined second threshold value.

3. The circuit of claim 1, wherein the low voltage reset circuit stops generating the reset signal when the detected voltage level is lower than a predetermined third threshold value.

4. The circuit of claim 1, wherein the predetermined first threshold value is a lower limit of a normal operation voltage.

5. The circuit of claim 1, wherein the clock generator generates two series of clocks, and the clock generator adjusts or stops one series of clocks but still provides the other series of clocks when the low voltage reset circuit generates the adjustment signal.

6. A method of adjusting system clock in low voltage detection, comprising:
 supplying a clock to at least one circuit;
 detecting a level of a supplied voltage to generate a detection result;
 generating an adjustment signal in response to the supplied voltage being lower than a predetermined first threshold value to control a clock generator according to the detection result, so that the clock generator adjusts or stops the clock supplied to the at least one circuit; and
 generating a reset signal in response to a predetermined second threshold value that causes the at least one circuit to be reset to a predetermined value, wherein the predetermined first threshold value is greater than the predetermined second threshold value.

7. The method of claim 6, wherein the clock generator adjusts or stops a clock when receiving the adjustment signal.

8. The method of claim 6, wherein the clock generator generates two series of clocks, and the clock generator adjusts or stops one series of clocks but still provides the other series of clocks when it receives the adjustment signal.

9. The method of claim 6, wherein the adjustment signal is not generated when the level of the supplied voltage is lower than the predetermined second threshold value.

10. The method of claim 6, wherein the reset signal is generated when the level of the supplied voltage is lower than a predetermined second threshold value.

11. The method of claim 10, wherein the reset signal is stopped when the level of the supplied voltage is lower than a predetermined third threshold value.

12. The method of claim 6, wherein the predetermined first threshold value is a lower limit of a normal operation voltage.

* * * * *